(12) United States Patent
Ishii

(10) Patent No.: US 8,395,401 B2
(45) Date of Patent: Mar. 12, 2013

(54) METHOD FOR SETTING CONTACT PARAMETER AND RECORDING MEDIUM HAVING PROGRAM FOR SETTING CONTACT PARAMETER RECORDED THEREON

(75) Inventor: Kazunari Ishii, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 432 days.

(21) Appl. No.: 12/749,587

(22) Filed: Mar. 30, 2010

(65) Prior Publication Data

US 2010/0244876 A1    Sep. 30, 2010

(30) Foreign Application Priority Data

Mar. 31, 2009   (JP) .................................. 2009-085164

(51) Int. Cl.
*G01R 31/00*   (2006.01)
(52) U.S. Cl. ................. 324/750.16; 324/754.1
(58) Field of Classification Search .......... None
See application file for complete search history.

(56) References Cited

U.S. PATENT DOCUMENTS

| | | | | |
|---|---|---|---|---|
| 5,436,571 A | * | 7/1995 | Karasawa | ............... 324/750.19 |
| 7,218,127 B2 | | 5/2007 | Cooper et al. | |
| 7,463,043 B2 | | 12/2008 | Cooper et al. | |
| 2008/0068033 A1 | * | 3/2008 | Kagami | ........................ 324/758 |
| 2009/0085592 A1 | | 4/2009 | Cooper et al. | |

FOREIGN PATENT DOCUMENTS

| | | |
|---|---|---|
| JP | 11-145221 A | 5/1999 |
| JP | 2007-95753 A | 4/2007 |
| JP | 2007-523350 A | 8/2007 |

* cited by examiner

*Primary Examiner* — Minh N Tang
(74) *Attorney, Agent, or Firm* — Abelman, Frayne & Schwab

(57) ABSTRACT

Disclosed is a method to set contact parameters, which can simulate the entire contact process of devices of a semiconductor wafer with probes while visually checking the contact parameters. The method includes preparing a coordinate graph including a time axis and a height axis, and setting contact parameters of the semiconductor wafer by specifying a plurality of points on the coordinate graph by a plurality of upward/downward movement positions of the semiconductor wafer during electrical contact of the electrode pads of the semiconductor wafer with the plurality of probes or separation of the electrode pads of the semiconductor wafer from the plurality of probes, and time required for the semiconductor wafer to move until reaching the upward/downward movement positions, respectively, and displaying a broken-line graph through connecting the specified points with straight-lines.

5 Claims, 6 Drawing Sheets

METHOD FOR SETTING CONTACT PARAMETER AND RECORDING MEDIUM HAVING PROGRAM FOR SETTING CONTACT PARAMETER RECORDED THEREON

This application is based on and claims priority from Japanese Patent Application No. 2009-085164, filed on Mar. 31, 2009, with the Japanese Patent Office, the disclosure of which is incorporated herein in its entirety by reference.

TECHNICAL FIELD

The present disclosure relates to a method for setting contact parameters that are used for electrically contacting electrode pads of a to-be-tested subject with probes when an electrical property test is performed on the to-be-tested subject, such as a semiconductor wafer, by using a testing apparatus, a program for setting the contact parameters, and a recording medium having a program for setting the contact parameters recorded thereon. More particularly, the present disclosure relates to a method for setting contact parameters, a program for setting the contact parameters, and a recording medium having a program for setting the contact parameters recorded thereon, which can set the contact parameters by using, for example, a personal computer, and visualize and simulate a series of contact processes of the electrode pads of devices with the probes.

BACKGROUND

In performing an electrical property test on a plurality of devices formed on a semiconductor wafer by a testing apparatus, a plurality of electrode pads formed on the respective devices of the semiconductor wafer are electrically contacted with a plurality of probes. Herein, the alignment of the plurality of electrode pads of the respective devices with the plurality of probes is carried out by moving the semiconductor wafer in a horizontal direction with respect to the plurality of probes, and then the semiconductor wafer is moved up toward the plurality of probes, thereby electrically contacting the plurality of electrode pads of the respective devices with the plurality of probes.

Hereinafter, one example of a conventional contact method for electrically contacting a plurality of electrode pads with a plurality of probes will be described with reference to FIGS. 7A and 7B. FIG. 7A shows a semiconductor wafer 1 with one electrode pad 2 formed thereon and one probe 3 which are zoomed in. In order to electrically contact electrode pad 2 with probe 3, a plurality of contact parameters have to be set. The contact parameters include, as shown in FIG. 7A, a height [a contact height (h)] of an electrode pad of a semiconductor wafer when electrode pad 2 is contacted with probe 3, an extent of electrode pad 2 coming into probe 3 after the contact [an overdrive (o)], and an extent of electrode pad 2 being taken away from probe 3 during the movement toward the next device [a downward amount]. Also, a speed of a semiconductor wafer and a position (c) where the speed is changed (a point where the speed is changed from a solid line arrow to a dashed line arrow), which are required to securely stick probe 3 into electrode pad 2, are necessary as contact parameters. Also, in some cases, the number of times electrode pad 2 contacts with probe 3 may be required as a contact parameter. All of these contact parameters are set by inputting their respective values through a screen of a display device attached to a testing apparatus. The contact operation of a semiconductor wafer is set by contact parameters, and thereby the test on a device is carried out without damage to electrode pad 2 and probe 3. The technologies on contact parameters are disclosed in the patent publications mentioned below.

Japanese Laid-Open Patent Publication HEI No. 11-145221 discloses a method for electrically securely contacting an electrode pad with a probe, in which the electrode pad is electrically contacted with the probe by being moved up to a first overdrive state, the electrode pad is slightly moved down, and then the electrode pad is moved up to a second overdrive state. In this case, the extent of the first and second overdrive or the electrode pad's downward movement is set as a contact parameter.

Also, Japanese Laid-Open Patent Publication No. 2007-095753 discloses that, in order to prevent an electrode pad from being damaged by a probe, the electrode pad is contacted with the probe with an upward movement speed which is significantly slowed down just prior to the contact of the electrode pad with the probe, and then the electrode pad is separated from the probe and the electrode pad is contacted with the probe again with an upward movement speed which is equal to or slightly higher than the upward movement speed prior to the contact. In this case, a plurality of upward movement speeds are set as contact parameters.

Also, Japanese Laid-Open Patent Publication No. 2007-523350 discloses that, in order to prevent an electrode pad from being damaged by a probe, the probe is disposed adjacently to the electrode pad, and the probe and the electrode pad electrically contact with each other by being moved in a horizontal direction with respect to each other. In this case, the distances where a semiconductor wafer and the probe are moved with respect to each other or the distances where a semiconductor wafer and the probe are moved in a horizontal direction until a leading end of the probe is disposed slightly below the upper surface of the electrode pad, are set as contact parameters.

However, in the conventional method for setting contact parameters, as shown in FIGS. 7A and 7B, although all of the contact parameters are set by using a screen of a display device attached to a testing apparatus, there is a limitation in the amount of information which can be displayed on the screen of the display device of the testing apparatus. Thus, all of the contact parameters cannot be set through one screen, and thereby there is no choice but to divide the contact parameters into a several groups and to set them by changing the display screen several times, as shown in FIG. 7B. In this case, since the display screen is changed into small screens to set the contact parameters, it is difficult to check the relationship between contact parameters set on the respective screens and the checking requires a long time. Moreover, it is difficult to understand the entire contact process of a semiconductor wafer with a probe. Also, the three patent publications mentioned above do not disclose a method for setting contact parameters.

SUMMARY

According to one embodiment, there is provided a method to set contact parameters for relative movement of a semiconductor wafer and a plurality of probes with respect to each other in order to perform an electrical property test on devices formed on the semiconductor wafer through an electrical contact between electrode pads of the devices and the plurality of probes. The method includes preparing, on a display screen of a computer, a coordinate graph including a first axis indicating a time, and a second axis indicating a relative movement distance, and setting contact parameters by specifying a plurality of points on the coordinate graph by a plurality of relative movement positions on the second axis and time required for at least the semiconductor wafer to move until reaching the plurality of relative movement positions, respectively, on the first axis, and displaying a broken-line graph through connecting the specified plurality of points on the coordinate graph with straight-lines.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
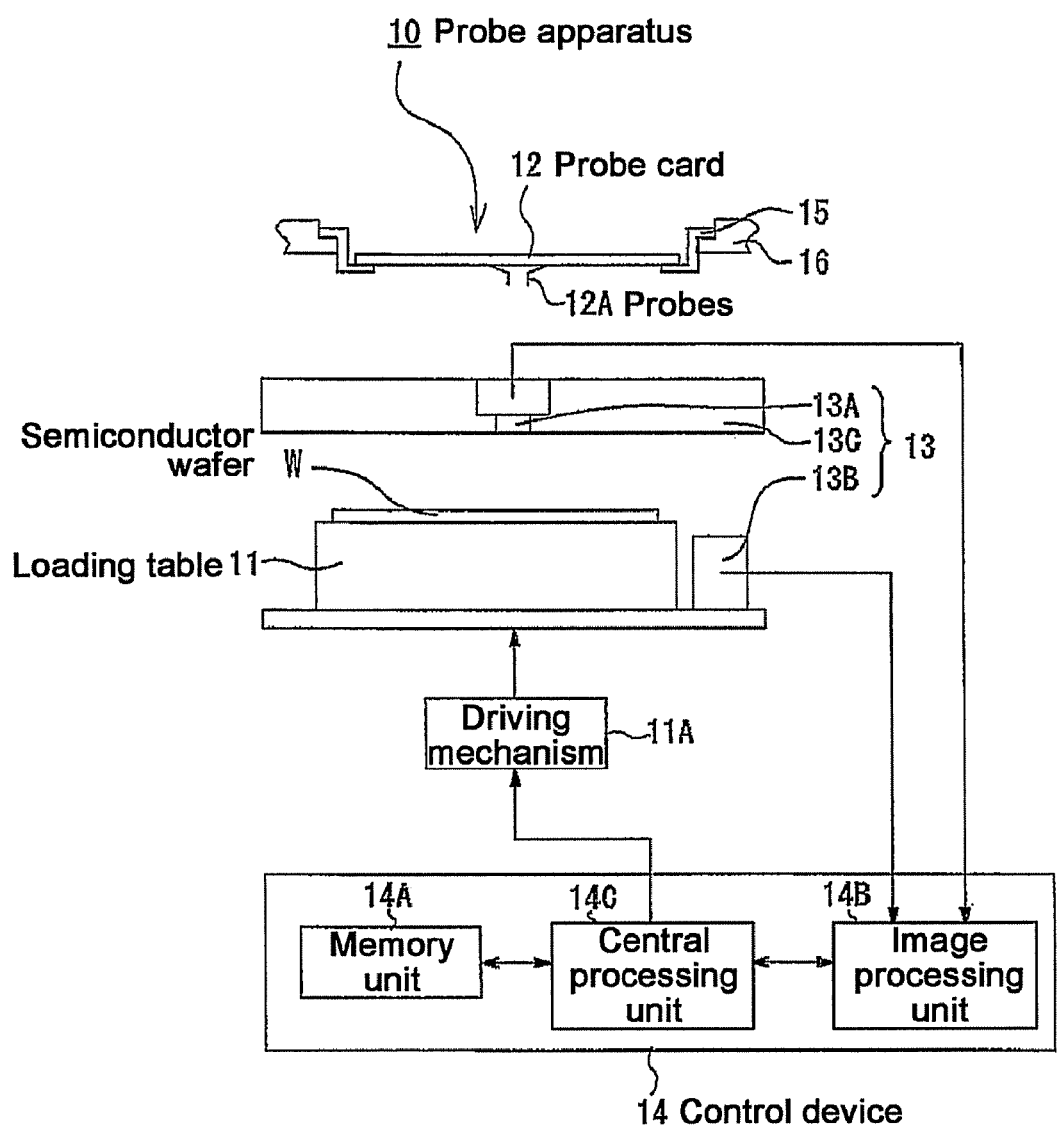
FIG. 1 is a configuration view illustrating one example of a testing apparatus employing a contact parameter setting program.

In the following detailed description, reference is made to the accompanying drawings, which form a part hereof. The illustrative embodiments described in the detailed description, drawings, and claims are not meant to be limiting. Other embodiments may be utilized, and other changes may be made, without departing from the spirit or scope of the subject matter presented here.

The present disclosure provides a method for setting contact parameters, a program for setting the contact parameters, and a recording medium having the program for setting the contact parameters recorded thereon, which can simulate the entire contact process of devices of a semiconductor wafer with probes by setting contact parameters while visually checking the contact process of electrode pads with the probes.

According to one embodiment, there is provided a method to set contact parameters for contacting a semiconductor wafer with a plurality of probes and separating the semiconductor wafer from the plurality of probes by moving the semiconductor wafer in order to perform an electrical property test on devices formed on the semiconductor wafer through an electrical contact between electrode pads of the devices and the plurality of probes. The method includes preparing, on a display screen of a computer, a coordinate graph including a first axis indicating a time, and a second axis indicating a movement distance of the semiconductor wafer, and setting contact parameters by specifying a plurality of points on the coordinate graph by a plurality of movement positions of the semiconductor wafer on the second axis and time required for the semiconductor wafer to move until reaching the plurality of movement positions, respectively, on the first axis, and displaying a broken-line graph through connecting the specified plurality of points on the coordinate graph with straight-lines.

According to another embodiment, there is provided a method to set contact parameters for contacting a semiconductor wafer with a plurality of probes and separating the semiconductor wafer from the plurality of probes by moving up and down the semiconductor wafer in order to perform an electrical property test on devices formed on the semiconductor wafer through an electrical contact between electrode pads of the devices and the plurality of probes. The method includes preparing, on a display screen of a computer, a coordinate graph including a first axis indicating a time, and a second axis indicating an upward/downward movement distance of the semiconductor wafer, and setting contact parameters by specifying a plurality of points by a plurality of upward/downward movement positions of the semiconductor wafer on the second axis during electrical contact of the electrode pads of the semiconductor wafer with the plurality of probes and separation of the electrode pads of the semiconductor wafer from the plurality of probes, and time required for the semiconductor wafer to move upward/downward until reaching the upward/downward movement positions, respectively, on the first axis, and displaying a broken-line graph through connecting the specified plurality of points on the coordinate graph with straight-lines.

Also, in setting of the contact parameters, when the semiconductor wafer moves up, a plurality of upward movement positions and upward movement times may be specified, and an upward movement speed of the semiconductor wafer may be set with a change.

Also, when the semiconductor wafer starts to move up, the upward movement speed may be set to be a high speed, and when the semiconductor wafer gets closer to the plurality of probes, the upward movement speed may be set to be a lower speed.

Also, the computer may be a personal computer.

According to still another embodiment, there is provided a recording medium having a program recorded thereon. The program sets contact parameters by executing the aforementioned method through operation of a computer of a testing apparatus.

In the contact parameter setting method and the recording medium with the contact parameter setting program recorded thereon, according to the present disclosure, the entire contact process of devices of a semiconductor wafer with the probes can be simulated by setting contact parameters while visually checking contact process of electrode pads with probes.

Hereinafter, illustrative embodiments according to the present disclosure will be described with reference to FIGS. 1 to 6.

According to the present exemplary embodiment, a method for setting contact parameters can be executed in a personal computer storing a contact parameter setting program according to the present exemplary embodiment. The contact parameter setting program according to the present exemplary embodiment can set contact parameters when operated in a personal computer, store the contact parameters in a recording medium, such as a flexible disc (FD) or a USB memory, after the setting of the contact parameters, and then operate as a part of a test program by applying the contact parameters to a testing apparatus via the recording medium.

First, a testing apparatus (probe apparatus) operating based on the contact parameters set by the contact parameter setting method of the present exemplary embodiment will be described. A probe apparatus 10, as shown in FIG. 1, includes a loading table 11 movable in X, Y, Z and θ directions within a prober chamber, a probe card 12 disposed above loading table 11, and an alignment mechanism 13 to perform alignment of a wafer W on loading table 11 with probe card 12. In probe apparatus 10, under the control of a control device 14, loading table 11 associates with alignment mechanism 13 to perform the alignment of a plurality of electrode pads of devices of semiconductor wafer W, with a plurality of probes 12A of probe card 12, and then loading table 11 performs index-transfer semiconductor wafer W so that an electrical property test on each device of semiconductor wafer W can be carried out.

Loading table 11, as shown in FIG. 1, has a driving mechanism 11A including an X-direction driving mechanism, a Y-direction driving mechanism, and a Z-direction driving mechanism. Thus, loading table 11 is configured to move in X, Y, Z, and θ directions via driving mechanism 11A under the control of control device 14. Probe card 12, as shown in FIG. 1, has a plurality of probes 12A, and is fixed to a head plate 16 by a card holder 15. The plurality of probes 12A are configured to contact with the plurality of electrode pads of the devices of semiconductor wafer W.

Alignment mechanism 13, as shown in FIG. 1, includes a first camera 13A moving between loading table 11 and probe card 12, a second camera 13B attached to the lateral side of loading table 11, and an alignment bridge 13C with first camera 13A fixed thereto. First camera 13A moves from the inside portion of the prober chamber to a probe center (which is located on the position extending from the center of a probe card) via alignment bridge 13C, and captures images of semiconductor wafer W on loading table 11 moving in X and Y directions with respect to the probe center. Second camera 13B moves to the position just below probes 12A of probe card 12 through loading table 11, and captures images of probes 12A at that position.

Control device 14 includes, as a main body, a computer which has a memory unit 14A, an image processing unit 14B, and a central processing unit 14C. Memory unit 14A stores programs, such as a contact parameter setting program of the present disclosure, and various test data. Image processing unit 14B performs image-processing based on image-capture signals from first and second cameras 13A, and 13B. Central processing unit 14C transmits and receives various data to and from memory unit 14A and image processing unit 14B and processes operations on the data. Central processing unit 14C reads a test program including a contact parameter setting program from memory unit 14A, and controls the configuration components, such as loading table 11, alignment mechanism 13, or the like.

Hereinafter, a contact parameter setting method according to the present exemplary embodiment, which uses a personal computer storing a previously prepared contact parameter setting program of the present embodiment as a dedicated tool, will be described with reference to FIGS. 2 to 6. This dedicated tool is operated by, for example, a basic OS, such as Windows.

Figure 2:
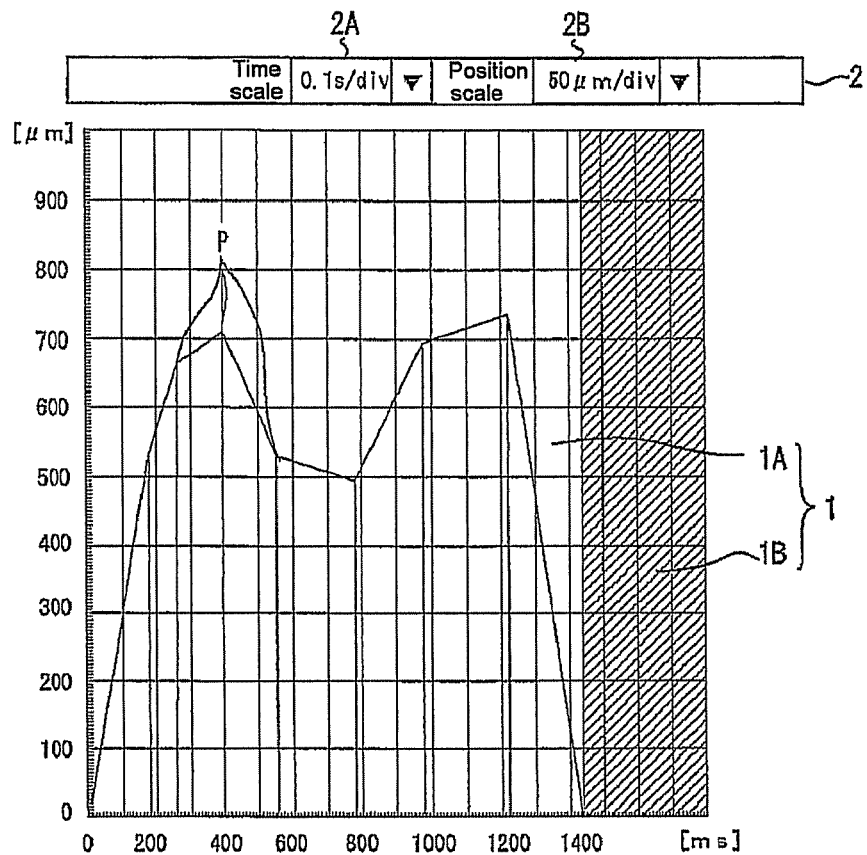
FIG. 2 is view illustrating a display screen of a personal computer displaying a state where contact parameters are set by a contact parameter setting method of the present exemplary embodiment.

When the contact parameter setting method according to the present exemplary embodiment is executed in a personal computer, a coordinate graph 1 shown in FIG. 2 is opened on a screen. In coordinate graph 1, a first axis (a horizontal axis) indicates a time axis, and a second axis (a longitudinal axis) indicates an axis of the position (height) of an upper surface of an electrode pad of semiconductor wafer W (hereinafter, referred to as 'height axis'). In the height axis, "0" indicates the height of an upper surface of an electrode pad of semiconductor wafer W when semiconductor wafer W is index-transferred. Thus, when loading table 11 index-transfers semiconductor wafer W, the height of the upper surface of the electrode pad is "0" in coordinate graph 1. Semiconductor wafer W, as shown in FIG. 1, horizontally moves by loading table 11 to complete alignment of electrode pads with probes 12A, and then moves up and down by loading table 11 so that the electrode pads can contact with probes 12A and separate from probes 12A. FIG. 2 shows an example of a visualized simulation result that, in an entire contact process of the electrode pad of semiconductor wafer W and probe 12A, a height of an electrode pad upper surface and an overdrive position [where the electrode pad electrically contacts with probe 12A] during index-transfer of the electrode pad of semiconductor wafer W and probe 12A are simulated and the simulation result is displayed as a graph in coordinate graph 1.

When the contact parameter setting program according to the present exemplary embodiment is operated in a personal computer, coordinate graph 1 is displayed on a screen of the personal computer, as shown in FIG. 2. In coordinate graph 1, respective processes of contacting semiconductor wafer W with probes 12A are connected to each other by, for example, a mouse to display the entire contact process as a broken-line graph. In this broken-line graph, the entire process can be seen at once, in which electrode pads of semiconductor wafer W are moved from an index-transfer position up to the position to contact with probes 12A, and semiconductor wafer W moves down by a predetermined distance, moves up to the position to contact with probes, allows the electrode pads to electrically contact with probes 12A by overdriving from the contact position, and returns to the index-transfer position. In other words, the broken-line graph of coordinate graph 1 shows that the electrode pads contact with probes 12A twice before the device test is done.

Figure 3:
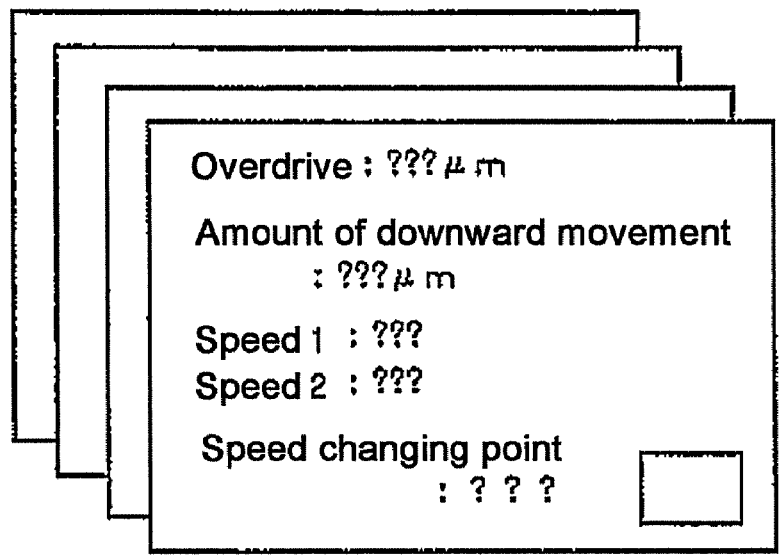
FIG. 3 is a view illustrating a display screen showing contact parameters set by the testing apparatus shown in FIG. 1.

Also, above coordinate graph 1, a toolbar 2 is displayed. As shown in FIG. 2, toolbar 2 includes a time scale display 2A for showing the scale of time in accordance with the scale of coordinate graph 1, and a position scale display 2B for showing the scale of height of electrode pads. Also, below coordinate graph 1, a table 3 is displayed. In table 3, an object position, an upward/downward movement speed, an accelerating time, and a decelerating time, which are calculated based on the respective connecting line data of the broken-line graph displayed on coordinate graph 1, are displayed as contact parameters. In a conventional method, these contact parameters had to be set by sequentially changing screens via a display device screen of probe apparatus 10, as shown in FIG. 3.

Also, at the lateral side of table 3 (at the right side in FIG. 2), an enlarged coordinate graph 4 showing a partly enlarged object portion is displayed. In enlarged coordinate graph 4, minute values which cannot be set in grids of coordinate graph 1 can be accurately set. Also, in coordinate graph 1, an area 1A having a specified point P and an area 1B not having a specified point are differently displayed by colors. In FIG. 2, area 1B, diagonal lines are drawn to separate it from area 1A. The color sectionalization is for the ease of use, and in some cases, areas 1A and 1B do not have to be separated from each other by colors.

In the present exemplary embodiment, as clearly shown from the broken-line graph in FIG. 2, the electrode pads of semiconductor wafer W contact with probes 12A twice, and the electrode pads and probes 12A electrically contact with each other through the overdriving during the second contact.

There are speed changing points during moving-up or moving-down of the electrode pads so as to change the high speed to the low speed, except when the electrode pads return to the index position after the electrode pads and probes 12A electrically contact with each other. The change in a speed during the moving up prevents the electrode pads from being damaged by probes 12A, and increases the throughput of the test. This setting may be simply carried out in coordinate graph 1 as will be described hereinafter.

Figure 4:
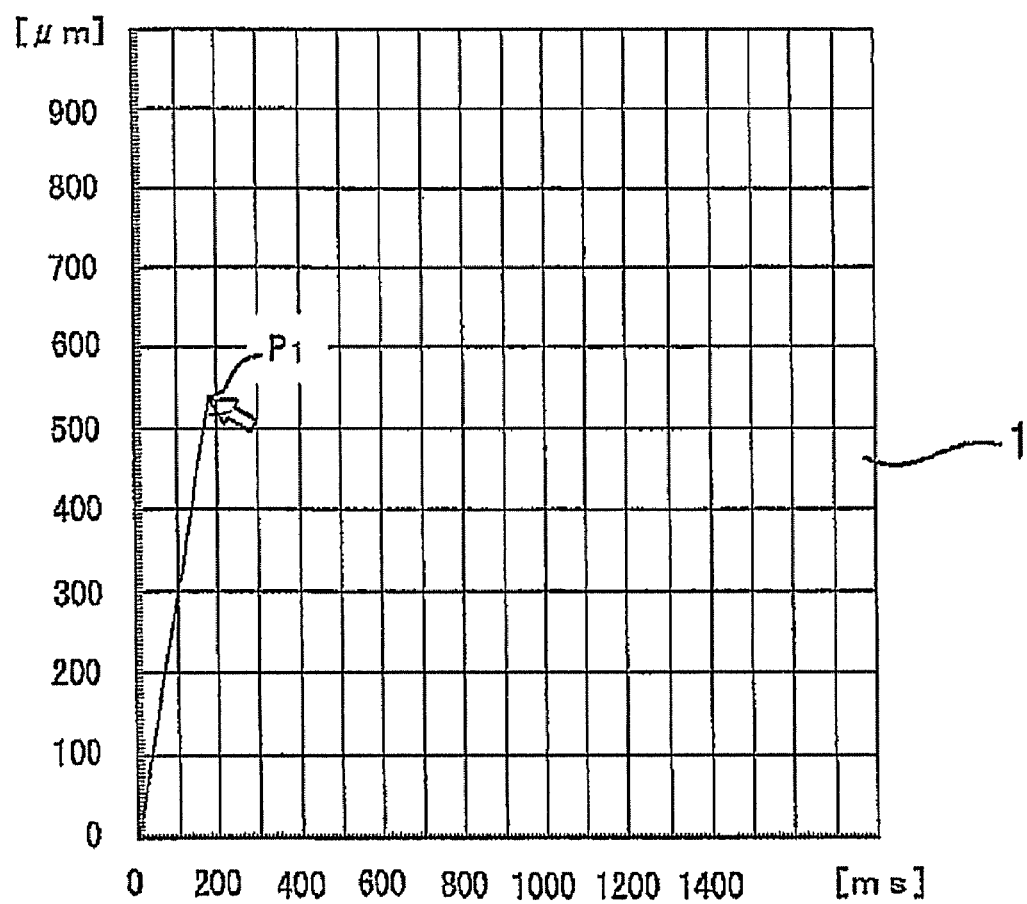
FIG. 4 is a coordinate graph showing a process of a contact parameter setting method, on the display screen shown in FIG. 2.

In order to set contact parameters by using coordinate graph 1, as shown in FIG. 4, an operator specifies the origin of coordinate graph 1 by clicking a mouse, and then he specifies the first object position and the required time from the origin to this position and clicks the first object position as shown by the arrow in FIG. 4. Thus, the first object position is determined as a specified point P1 while the origin and specified point P1 are connected to each other. Herein, the central processing unit of the personal computer automatically calculates the upward movement speed and the accelerating time from the origin to specified point P1, based on the position data of the origin and specified point P1, and displays the results as contact parameters on table 3. Herein, in order to increase the upward movement speed by reducing the time required to reach the object position, the time required to reach it is reduced without a change of the object position, thereby increasing the slope of the connecting line. Meanwhile, in order to reduce the upward movement speed, the required time is prolonged without a change of the object position, thereby decreasing the slope of the connecting line. When semiconductor wafer W is moved up to the position to contact with probes 12A at the first upward movement speed, the electrode pads may be damaged by probes 12A. Thus, before contacting with probes 12A, the upward movement speed of semiconductor wafer may be decreased.

Figure 5:
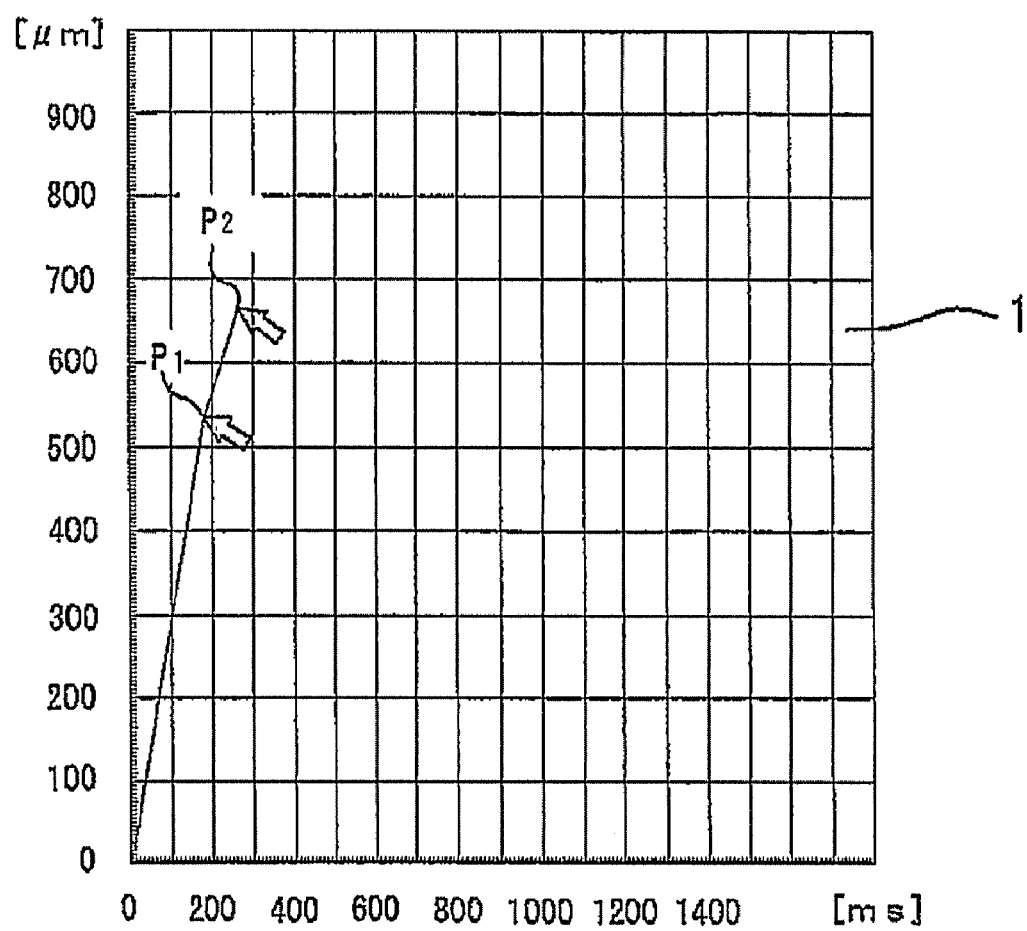
FIG. 5 is a coordinate graph showing a process of a contact parameter setting method, on the display screen shown in FIG. 2, which is following the process in FIG. 4.
Figure 6:
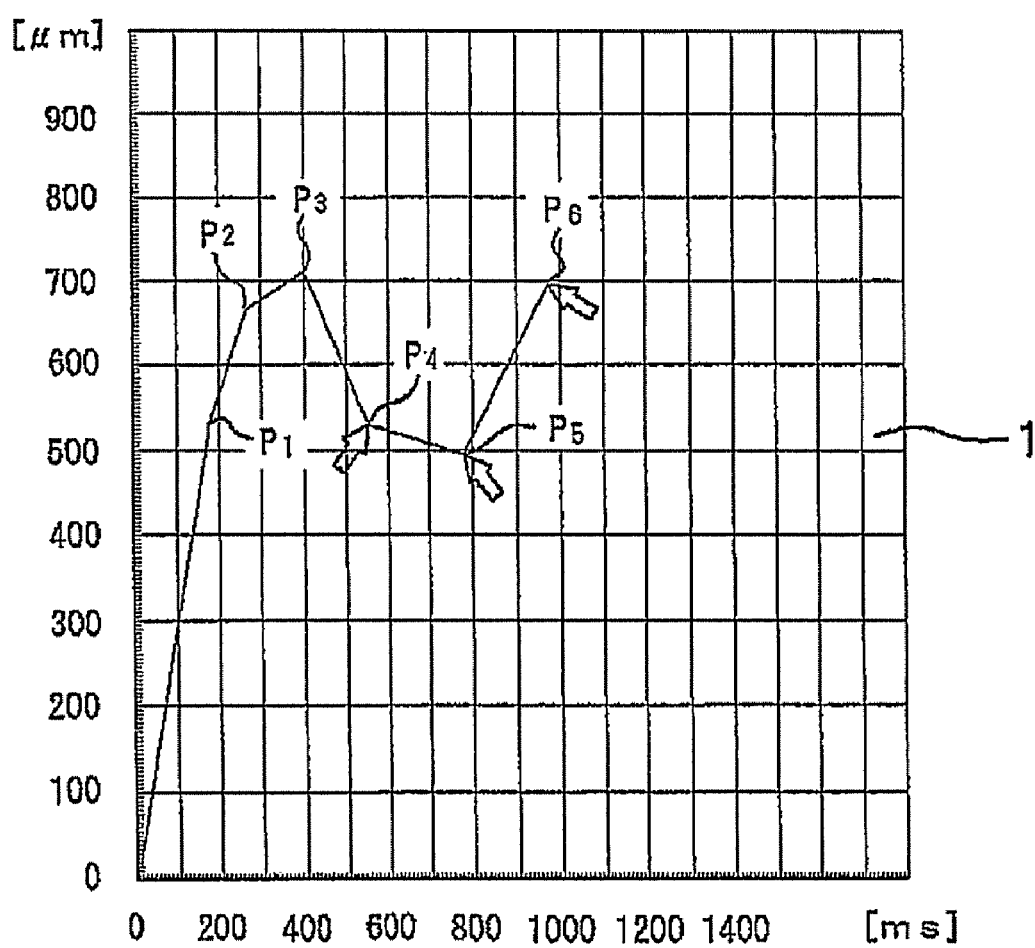
FIG. 6 is a coordinate graph showing a process of a contact parameter setting method, on the display screen shown in FIG. 2, which is following the process in FIG. 5.
Figure 7A:
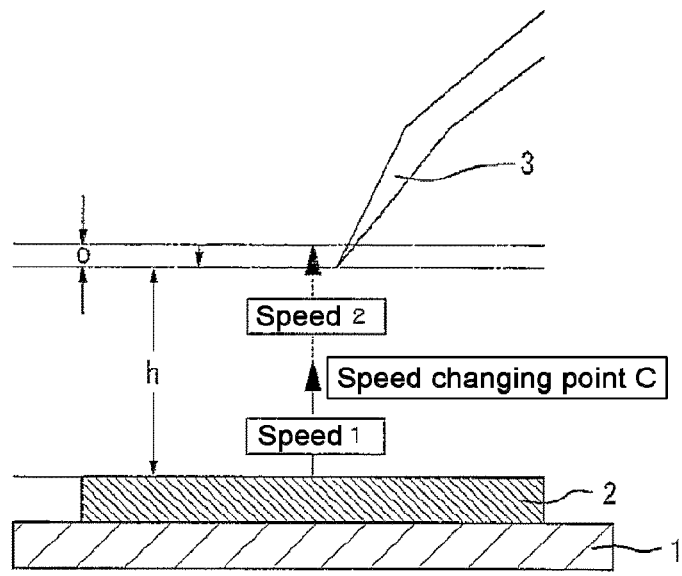
FIGS. 7A and 7B are explanatory views showing examples of a conventional contact parameter setting method, respectively.
Figure 7B:
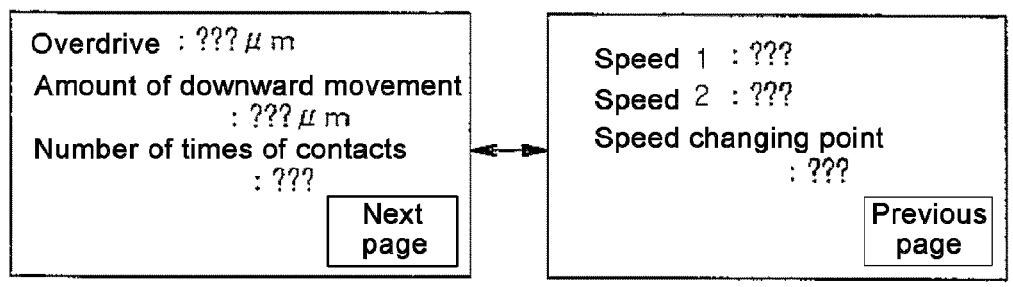

In order to specify the second specified point P2, an operator clicks a mouse at first specified point P1 as shown by the arrow in FIG. 5, specifies the second object position and the time required to reach this position, and clicks the mouse at that position as shown by the arrow. Then, first specified point P1 and second specified point P2 are connected to each other, and thereby a connecting line having a slope slightly lower than that of the connecting line between the origin and first specified point P1 is drawn. Also, as shown in FIG. 6, a third specified point P3 is specified as a contact position between the electrode pads and probes 12A. When third specified point P3 is specified as the contact position, the upward movement speed is more decreased to prevent the electrode pads from being damaged by probes 12A, as shown in FIG. 6. In this case, a mouse is used to specify the object position as the contact position and the time required to reach that, and to set third specified point P3. The contact position between the electrode pads and probes 12A is the position that the electrode pads are actually not subjected to a needle pressure from probes 12A. Herein, first specified point P1 and second specified point P2 are automatically recorded as changing points of upward movement speeds of semiconductor wafer W, that is, contact parameters, on table 3.

In the present exemplary embodiment, as described above, since the electrode pads of semiconductor wafer W contact with probes 12A twice before the electrode pads and probes 12A electrically contact with each other by the overdriving of semiconductor wafer W, a fourth specified point P4 is positioned at the position which is lowered by a predetermined distance (an of downward movement) from third specified point P3 (the contact position between the electrode pads and probes 12A), as shown by the arrow in FIG. 6. When semiconductor wafer W is moved down, the downward movement speed is dropped at fourth specified point P4 on the way to a fifth specified point P5.

In specifying a sixth specified point P6, the object position is specified, which is nearer to probes 12A than fifth specified point P5. Then, the required time from fifth specified point P5 to that position is specified, and a mouse is clicked as shown by the arrow, thereby connecting a line from fifth specified point P5 to sixth specified point P6. Then, the height of sixth specified point P6 and the required time from fifth specified point P5 are recorded as contact parameters on table 3. As described above, a series of contact processes, in which semiconductor wafer W moves up from an index-transfer position, electrically contacts with probes 12A, and returns to the index-transfer position, are displayed by the broken-line graph in coordinate graph 1 as shown in FIG. 2. Thus, the series of contact processes can be simulated and visually understood.

After being set in the personal computer as described above, the contact parameters are recorded in a recording medium, such as an FD or a USB memory. This recording medium may be applied to the computer of control device 14 of probe apparatus 10. In a predetermined test performed by probe apparatus 10, contact parameters are set within control device 14 of probe apparatus 10 by operating a contact parameter setting program as a test program, and the electrode pads of semiconductor wafer W contact with probes 12A based on the contact parameters. Also, the contact parameters recorded in memory unit 14A of control device 14 of probe apparatus 10 may be read and re-edited on control device 14 or the personal computer.

As described above, according to the present exemplary embodiment, in order to perform the electrical property test on devices formed on semiconductor wafer W through the electrical contact between the electrode pads of the devices and a plurality of probes, the method for setting contact parameters for contacting semiconductor wafer W with the plurality of probes and separating semiconductor wafer W from the plurality of probes by moving up and down semiconductor wafer W, includes the steps of preparing coordinate graph 1 including a time axis and a height axis, specifying a plurality of points P on coordinate graph 1 by semiconductor wafer W's upward/downward movement positions and semiconductor wafer W's upward/downward movement times required to reach these upward/downward movement positions while the respective electrode pads of semiconductor wafer W electrically contact with probes 12A and separate from probes 12A, and setting the contact parameters of semiconductor wafer W by displaying as a broken-line graph through connecting the specified plurality of points P with the straight-lines. Thus, in coordinate graph 1, the entire contact process of the devices of semiconductor wafer W with probes 12A can be simulated while the contact parameters are visually seen and set. Accordingly, compared to a conventional setting method in which contact parameters are partially set by changing display screens, this method according to the present exemplary embodiment can simply set contact parameters, thereby significantly reducing the number of steps required for the setting.

Also, according to the present exemplary embodiment, when semiconductor wafer W is moved up, the upward movement position and the upward movement time are specified a plurality of times, and the upward movement speed of semiconductor wafer W is set with a change of the speed. Thus, the upward movement speed of semiconductor wafer W may be changed from a high speed to a low speed according to the kind of semiconductor wafer W, thereby allowing the test on semiconductor wafer W to be performed with high throughput without damage to the electrode pads. Also, since the contact parameters are set on a personal computer, they can be simply set regardless of where probe apparatus 10 is provided, and the kind of semiconductor wafer W.

Also, although a semiconductor wafer was described to move in up and down direction (Z-direction) in the above embodiment, the relationship between X-direction movement and a time axis, and between Y-direction movement and a time axis can be applicable in the same manner as in the above described embodiment, and also, the relationship between a slope direction movement and a time axis in three dimensions with X, Y, and Z directions can be applicable in the same manner as in the above described embodiment. Also, although probes 12A are fixed and semiconductor wafer W is moved to contact the electrode pads with probes 12A in the above described embodiment, a testing apparatus with a fixed semiconductor wafer W and movable probes, or a testing apparatus with a movable semiconductor wafer W and movable probes can be applicable.

The present disclosure may be appropriately applied to a testing apparatus for testing a semiconductor wafer.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A method for setting contact parameters for a relative movement between an electrode pad of a device formed on a semiconductor wafer and a plurality of probes in order to perform an electrical property test through an electrical contact between the electrode pad of the device and the plurality of probes, the method comprising:

providing a coordinate graph comprising a first axis indicating a time that an upper surface of the electrode pad of a device moves and a second axis indicating a height of the upper surface of the electrode pad of a device on a display screen of the computer, the coordinate graph being a simulation result of an entire contact process of the electrode pad of a device and at least one of the plurality of probes;

providing at least one table at the same display screen of the computer indicating the simulation result corresponding to the coordinate graph including at least one of the height of the upper surface of the electrode pad of a device and a moving speed of the upper surface of the electrode pad of a device as the contact parameters; and receiving a signal input from an operator specifying a plurality of points on the coordinate graph on the display screen of the computer, each of the plurality of points indicates the height of the upper surface of the electrode pad of a device on the second axis and the time that the upper surface of the electrode pad of a device moves to reach the height on the second axis; and displaying a broken-line graph through connecting the specified plurality of points on the coordinate graph with straight-lines along with specified values corresponding to the specified plurality of points on the table on the same screen, thereby allowing the operator to set the contact parameters.

2. The method as claimed in claim 1, wherein in setting of the contact parameters, when the semiconductor wafer moves up, a plurality of upward movement positions and upward movement times are specified, and an upward movement speed of the semiconductor wafer is set with a change.

3. The method as claimed in claim 2, wherein when the semiconductor wafer starts to move up, the upward movement speed is set to be a high speed, and when the semiconductor wafer gets closer to the plurality of probes, the upward movement speed is set to be a lower speed.

4. The method as claimed in claim 1, wherein the computer is a personal computer.

5. A recording medium having a program recorded thereon, the program setting contact parameters by executing the method as claimed in claim 1 through operation of a computer of a testing apparatus.

* * * * *